United States Patent [19]

Rynkiewicz

[11] Patent Number: 5,293,145
[45] Date of Patent: Mar. 8, 1994

[54] SWITCH BATTERY CHARGER WITH REDUCED ELECTROMAGNETIC EMISSION

[75] Inventor: Robert Rynkiewicz, Minneapolis, Minn.

[73] Assignee: Onan Corporation, Fridley, Minn.

[21] Appl. No.: 24,801

[22] Filed: Mar. 1, 1993

Related U.S. Application Data

[63] Continuation of Ser. No. 409,627, Sep. 19, 1989, abandoned.

[51] Int. Cl.$^5$ .................... H01F 15/02; H01F 27/30
[52] U.S. Cl. ................................ 336/65; 29/602.1; 320/21; 336/192; 336/198; 336/223
[58] Field of Search .............. 320/21; 29/602.1; 336/65, 222, 223, 198, 208, 200, 192

[56] References Cited

U.S. PATENT DOCUMENTS

| | | | |
|---|---|---|---|
| 3,360,754 | 12/1967 | Gerdiman | 336/223 |
| 3,500,252 | 3/1970 | Wakker | 336/223 |
| 3,500,274 | 3/1970 | Matsuura et al. | 336/65 |
| 3,548,355 | 12/1970 | Martincic et al. | 336/223 |
| 3,826,967 | 7/1974 | Wilkinson et al. | 336/223 |
| 3,911,332 | 10/1975 | Kunkle | 336/223 |
| 4,399,843 | 8/1983 | Sedgewick | 29/596 |
| 4,455,545 | 6/1984 | Shelly | 336/223 |
| 4,507,640 | 3/1985 | Rich, III et al. | 336/223 |
| 4,538,132 | 8/1985 | Hiyama et al. | 336/223 X |
| 4,591,942 | 5/1986 | Willard et al. | 336/223 X |
| 4,661,792 | 4/1987 | Watkins | 336/65 |
| 4,766,406 | 8/1988 | Kurgan et al. | 336/65 |
| 4,814,735 | 3/1989 | Williamson | 336/223 X |
| 4,833,437 | 5/1989 | Williamson | 336/223 |

FOREIGN PATENT DOCUMENTS

| | | | |
|---|---|---|---|
| 2503691 | 8/1976 | Fed. Rep. of Germany | 336/223 |
| 1048526 | 10/1983 | U.S.S.R. | 336/223 |

OTHER PUBLICATIONS

IBM Technical Disclosure Bulletin, "Flat Winding Transformer", Radcliffe, vol. 22, No. 9, Feb. 1980, pp. 4009, 223-336.

"Solder-free Printed Circuit Mountable Transformer," Manoon et al, IBM Technical Disclosure Bulletin, vol. 27, No. 1A, Jun. 1989, pp. 146-148.

Article: Underwriters Laboratories, Inc., *Standard for Safety*, UL458, "Power Converters and Power-Converter Systems for Recreational Vehicles", Sections 25 and 37.

*Unitrode Applications Handbook 1985-1986*, Application Note entitled A 25 Watt Off-Line Flyback Switching Regulator, pp. 254-259.

*Mospower Applications Handbook*, "6.1.6 A Low Cost Regulator for Microprocessor applications Build a 100 kHZ Multiple Output Switching Regulator (DA80-1)", pp. 6-62 through 6-67; Siliconix Incorporated, copyright 1984.

Catalog: *Fair-Rite Linear Ferrites*, Permag Corp., 10th Edition, Rev. 1; pp. 105, 15, 71.

*A Handbook Series on Electromagnetic Interference and Compatability*, vol. 4: Filters and Power Conditioning, Interference Control Technologies, Inc., 1989; Chapter 5: "EMC in Power Supplies", by R. Rynkiewicz.

*The International Journal of EMC, ITEM 1989*, Robar Industries, Inc.; "Testing and Troubleshooting the Common Mode Inductor":, pp. 14-22.

*Primary Examiner*—Thomas J. Kozma
*Attorney, Agent, or Firm*—Merchant, Gould, Smith, Edell, Welter & Schmidt

[57] ABSTRACT

A method and apparatus for reducing electromagnetic emissions from switching-type battery chargers safely and at low cost. The method and apparatus generally consists of enclosing the battery charger in a conductive metal case, electrically and physically isolating the low voltage, high current output components from the remainder of the circuitry, reducing the loop area of the output circuit, use of ferrite beads on various conductors, use of an output common-mode inductor wound within a ferrite core, use of inductors and transformers having foil windings, and use of a fusible resistor to protect internal circuitry.

3 Claims, 8 Drawing Sheets

SWITCH BATTERY CHARGER WITH REDUCED ELECTROMAGNETIC EMISSION

This is a continuation of application Ser. No. 07/409,627, filed Sep. 19, 1989, now abandoned.

TECHNICAL FIELD OF THE INVENTION

The present invention relates to the field of switching power supplies, and more specifically to both a method and apparatus for reducing electromagnetic emissions from switching type power supplies used in high current battery charging applications.

BACKGROUND OF THE INVENTION

High current battery charging applications are recreational vehicles (RV's). A recreational vehicle is a mobile unit used for leisure activities. It typically consists of an enclosed sleeping area built on a truck or a truck-like vehicle. RVs come in many types, ranging from small, inexpensive units used for light camping to very large, expensive motor homes in which a number of people can spend long periods in a high degree of comfort. A common characteristic of RV's is that they have only a limited interior space available. This is true of even the largest RV's since they are typically filled with furniture, refrigerators, stoves, bathrooms, air conditioners, and other accessories.

Since RVs are used primarily for leisure, the comfort and convenience of their occupants is very important. Anything which reduces the comfort or convenience, such as excessive noise, interference with other accessories, excessive heating of interior spaces, or reductions in available interior space, is to be avoided.

As mentioned, an RV may have numerous accessories, which may include such items as television sets, furnace blowers, incandescent lights, radios, and stereos. Electrical power for these accessories is typically stored in twelve (12) volt direct current (VDC) lead acid batteries, similar to those found in automobiles and trucks. Since battery energy eventually becomes depleted, either because of energy used by the accessories or through internal discharge, some method of battery charging is required. The most commonly used method is to charge the batteries from an external source, such as a utility hookup at an RV campground. In RV terminology, the utility hookup is referred to as "shore power."

Shore power is typically one hundred and twenty (120) volts alternating current (VAC). Actual battery voltage will typically range from below eleven (11) volts to over fourteen (14) volts, depending on the charge on the batteries. Charging batteries from shore power requires an apparatus to convert shore power to a form suitable for battery charging. The apparatuses used are typically electrical power supplies modified for battery charging. These power supplies are classifiable into three general types, linear converters, ferroresonant converters, and switching converters.

A typical linear converter consists of a power transformer to transform the shore power to a lower AC voltage, and a rectifier to convert the AC voltage to DC. The voltage at the output of the linear converter consists of pulses of direct current; the pulse amplitude being largely dependant on the voltage amplitude of the shore power and on the current supplied to the batteries. The linear converter therefore has poor regulation with respect to changes in the shore power and in the battery charge.

Linear chargers have the advantages of simplicity and low cost. However, compared to other methods, they are heavy, bulky and inefficient. Additionally, they exhibit poor regulation against changes in shore power. If the shore power voltage drops, so does the battery charge current, if it rises, so does the battery charge current. While methods exist to correct this problem, they do so at the cost of additional circuit complexity and cost.

The pulsating nature of the output of the linear converter creates yet another drawback. Since the current supplied to the battery pulsates, it supplies a high peak current to the batteries, but a much lower average current. Therefore, the conductors and the battery must be designed to accommodate high currents.

While it is easy to understand that the problem with a low charging current is the increased time it takes to charge the batteries, the problem with excessive charging currents is more complicated. Since a battery has a limited rate at which it can convert charging current into stored chemical energy, any excess charging current is converted into unrecoverable heat. Additionally, excessive charging current causes the battery electrolyte to emit excessive gases which can produce an explosive mixture. The electrolyte must be replenished or it may "dry out" by losing electrolyte. When a battery dries out the internal resistance of the battery increases, which degrades the ability of the battery to supply current to the accessories. Therefore, an optimum design of a battery charger will cause the battery to charge as rapidly as possible consistent with low degradation in battery performance.

Unfortunately for the designer, the optimum charging rate for a lead-acid battery is not a constant, but follows a "voltage compliance" curve. At a low battery voltage, denoting a deeply discharged battery, the optimum battery charging current is high; as the battery takes a charge, the optimum charging current decreases; finally when the battery is fully charged, the charge rate is very low, typically referred to as a "trickle charge." The typical linear charger does not follow the voltage compliance curve. While linear chargers can be constructed so that the output follows the voltage compliance curve, the advantages of low cost and ease of construction are lost. Additionally, the low efficiency and large size and weight of linear charges place it at a competitive disadvantage with other types at high charging currents.

One solution to poor shore power regulation is the ferroresonant converter. A ferroresonant converter typically has a ferroresonant, or constant voltage, transformer and a rectifier circuit. The ferroresonant transformer outputs a relatively constant voltage over a wide range of input voltages. Additionally, a properly designed ferroresonant converter can follow the voltage compliance requirements of a lead acid battery. These advantages make the ferroresonant converter preferable over linear converters. Ferroresonant converters are typically made with current ratings in the 40–75 ampere range. However, since a ferroresonant converter is typically only 75% efficient, at a 12 VDC, 60 ampere output the ferroresonant converter inputs 960 watts and outputs only 720 watts. The remaining 240 watts are converted to waste heat, which is highly objectionable.

Another problem with ferroresonant converters operated at high power levels is that they emit excessive audible noise. This is because a ferroresonant converter has a transformer that is typically constructed from steel lamination so that eddy current losses are reduced. These lamination are subjected to strong magnetostrictive forces during high power operation. The magnetostrictive forces cause the lamination to vibrate at the shore power frequency which creates a highly objectionable hum.

Ferroresonant transformers are extremely frequency-sensitive; they may reduce their output voltage by three percent for a frequency deviation of one percent. This creates a problem because RVs may carry engine generator sets which typically have output power frequencies which are not accurately maintained. Therefore, when a ferroresonant converter is used to charge batteries from an engine generator set, the output voltage, and therefore charging current, is highly sensitive to changes in the engine generator's frequency.

The ferroresonant converter has yet another drawback in that, like the linear converter, the output consists of pulsating currents which require batteries and conductors designed to use the high peak current.

A further problem with ferroresonant converters, as with linear chargers, is their size and weight. However, since ferroresonant converters generally operate at higher power levels than linear converters, they are larger and the drawback is more pronounced. The size and weight is a result of the material used to make the transformers, which at low frequencies is typically laminated steel.

Another approach to battery charging is the "switching" type converter. In a switching battery charger the shore power is directly rectified, and the resulting DC voltage is applied to a semiconductor switch that, on a periodic basis, switches the rectified shore power to a power output transformer. The power output transformer outputs a lower AC voltage on its secondary winding which is then rectified, smoothed to a substantially pure direct current, and sent to the batteries being charged. The output voltage is sensed and used to control the switching circuit. When a higher output voltage is required, the semiconductor switch operates with a wider pulse width, causing the output voltage to rise. When a lower output voltage is need, the semiconductor switch operates with a narrower pulse width, causing the output voltage to drop.

Some advantages of the switching battery charger are readily explained. Since the input power is rectified, the switching battery chargers is insensitive to changes in input frequency. Additionally, because a switching battery charger typically operates at a frequency much higher then the human ear can detect, the objectionable hum found in ferroresonant and linear converters is eliminated. Finally, since the output of the switching battery charger is a substantially pure direct current, the conductors and the battery do not have to withstand the high peak currents of a pulsating output.

Other advantages of switching battery chargers are not as apparent. The switching battery charger has a smaller size and lower weight for a given output current, and a much higher operating efficiency which reduces heat output. The small size and low weight result because the switching battery charger operates at a high frequency, which permits the power output transformer to be made from low weight ferrites which require less space then steel laminates. The reduced heat output results because high frequency transformers are more efficient than low frequency transformers, which means the transformer converts less input power to heat.

The switching battery charger's chief drawbacks are the high unit cost and excessive electromagnetic emissions. High cost seriously impedes the use of switching battery chargers in RV's since the demand is very price sensitive. To be competitive, the cost of a switching battery charger must not override its advantages.

Electromagnetic emissions are radiated electromagnetic energy. Electromagnetic emissions may interfere with the proper operation of sensitive devices. Three things must coexist for electromagnetic emissions to be a problem; there must be a generator of electromagnetic emissions, a propagation medium, and a victim. Switching battery chargers generate electromagnetic emissions due to the high rates of current change typically existing inside the chargers; current undergoing a high rate of change tends to generate electromagnetic emissions. The atmosphere acts as a good propagation medium and, in RV applications, the victim typically is a television set.

RV operators will generally tolerate only very low levels of television (TV) interference, essentially none. This is a problem since RV's can be located many miles from a broadcast antenna which results in a poor TV signal. Instead of the one thousand (1,000) microvolts available with a good antenna in some urban areas, the RV operator may have only two hundred (200) microvolts of signal at the TV antenna terminals. To complicate matters further, in an RV the distance between any emitter and the victim is very small. This combination of low TV signal strength and short distances between emitter and victim makes TV reception in an RV highly susceptible to electromagnetic emissions from inside the RV.

The United States Federal Communications Commission (FCC) rules for permissible radio frequency interference from computer equipment, Part 15, Sub. J, implies that electromagnetic emissions from computers should be consistent with minimal interference with TV reception in a residential urban situation. This standard is frequently used for equipment similar to switching battery chargers, even though mobile units such as RV's are exempt from its requirements. Numerous consumer complaints of switching chargers causing TV interference clearly indicate that meeting this standard is insufficient for RV applications.

The majority of electromagnetic emissions from switching battery chargers results from the fast switching of high currents in the output circuit. Current in the output circuit of a switching battery charger is typically rectangular in nature with pulse widths in the order of thirteen (13) microseconds with maximum rates of change of current in the order of two hundred (200) amperes per microsecond. While slowing the rates of change decreases the electromagnetic emissions, it increases the power dissipated in the switching transistors and diodes. This increased dissipation necessitates larger heatsinks and power transistors, causes a reduction in operating efficiency, and increases the cost, size and weight of the resulting switching battery charger.

Numerous techniques are available for reducing electromagnetic emissions. One method is to space the conductors carrying high current close together to minimize the conductor's radiating characteristics. Radiation is reduced because the loop area, a physical measure of antenna effects, is reduced which tends to reduce the electromagnetic emissions. However, Underwriter Laboratory's safety standard UL 458, a voluntary standard for recreational vehicle power converters, dictates the minimum spacing between printed circuit board conductors and between components and the chassis. Therefore, UL 458 limits the reduction in conductor spacing.

Another method of reducing electromagnetic emissions is to enclose the switching battery charger in a conductive enclosure. However, at the power levels required for high speed battery charging, this is only partially successful since openings are required for the entry and exit of cooling air. While a fine metal mesh can be used, it has a cost disadvantage because the mesh is another material to buy, and bonding it cheaply and effectively to the enclosure is a problem. Any metallic seam of the enclosure that is not completely bonded, such as between mating parts of the enclosure, can act as radiating slots. Additionally, a metal enclosure is more effective on the electric field component of the electromagnetic emissions than on the magnetic field component, which can be a problem.

As mentioned previously, in addition to the electromagnetic emissions problem, another problem associated with switching battery chargers is their overall cost and difficulty of assembly. Any acceptable switching battery charger must be easily and cheaply made and be free of assembly induced defects.

One area of difficulty in assembly switching battery chargers is the high current required, which necessitates large conductors. Since large conductors are generally difficult to work with, it is desirable to reduce the number of connections using the large conductors. One method of reducing the number of connections would be to terminate large conductors directly at the point at which the high current is used. However, wound magnetic devices such as inductors and transformers typically connect their windings to terminal lugs on the magnetic device and then attach jumper conductors between the terminal lugs and the signal destination.

Large round wires may cause problems during assembly, including the difficulties of wrapping the wire around a post, orientating the wire properly, and controlling the applied heat during soldering which contributes to temperature stress if the solder junction is overheated, and poor soldering if under heated. Additionally, if the round wire directly terminates on a printed circuit board conductor, high current densities may result from a small surface area carrying all the current, particularly in the transition from the round cross-section of the wire to the flat cross-section of the printed circuit board conductor. When solder fills a void between conductors, such as between a round wire and a hole, the solder must carry current during operation. At the high currents existing in a switching battery charger, the high current passing through the solder can produce temperature cycling and induce undesired metallurgical changes in the solder, such as selective crystallization of alloying elements.

The present invention solves these and other problems associated with switching battery chargers.

SUMMARY OF THE INVENTION

The present invention describes a method and apparatus for reducing electromagnetic emissions from switching battery chargers at low cost.

In one embodiment of the present invention, a switching battery charger is constructed on two boards physically separate from each other and coupled together magnetically by a power output transformer. One board contains all of the high current, low voltage output circuitry and the other board contains all other circuitry.

In another embodiment the two boards and power output transformer are enclosed in a metal housing.

In another embodiment, the board containing the high-current, low voltage output electronics includes a common-mode inductor wound within a ferrite core that directly terminates on the board. The common-mode inductor absorbs the undesired high frequency signals on the power out line.

In yet another embodiment of the present invention, the board having the high-current, low voltage output components is electrostatically shielded from the remainder of the electronic components.

In still another embodiment of the present invention, the board containing the high-current, low voltage output electronics has a conductor pattern arranged so that its loop area is minimized to reduce electromagnetic emissions, and has a magnetic flux cancelling geometry so that the magnetic component of a radiated signal is minimized.

In still another embodiment of the present invention, the power output transformer has a ferrite bead on its center tap lead-in wire and another ferrite bead is around conductors going to a fan.

In still another embodiment, the power output transformer, power output inductor and the common-mode output inductor have windings wound with a flat foil conductor that terminates directly on a printed circuit board, to ease assembly. This offers numerous advantages over round wire conductors.

In still another embodiment of the present invention a fan having a ferrite bead around its power lead to reduce electromagnetic emissions is used for cooling.

These and various other advantages and features of novelty which characterize the invention are pointed out with particularity in the claims annexed hereto and forming a part hereof. However, for a better understanding of the invention, its advantages, and objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

These and various other advantages and features of novelty which characterize the invention are pointed out with particularity in the claims annexed hereto and forming apart hereof. However, for a better understanding of the invention, its advantages, and the objects obtained by its use, reference should be made to the accompanying drawings and descriptive matter, which form a further part hereof, and in which there is illustrated and described a preferred embodiment of the invention.

Referring now to the drawings wherein like numerals indicate corresponding parts throughout the several views.

DETAILED DESCRIPTION OF THE PREFERRED EMBODIMENT OF THE PRESENT INVENTION

In the following detailed description of a preferred embodiment of a switching battery charger in accordance with the principles of the present invention, reference is made to the figures which form a part hereof. It is to be understood; however, that other embodiments may be utilized without departing from the spirit and scope of the present invention. The following detailed description is therefore not to be taken in a limiting sense and the scope of the present invention is defined by the appended claims.

Figure 1:
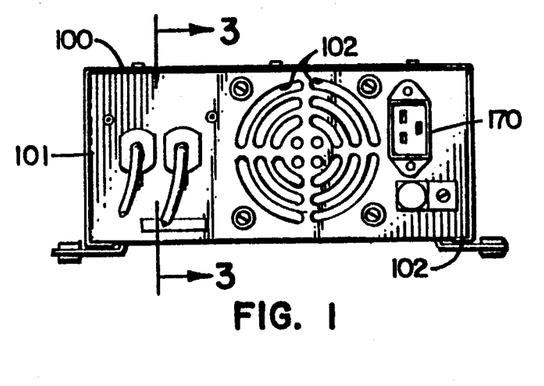
FIG. 1 is a back view of an embodiment of a switching battery charger in accordance with the principles of the present invention.

FIG. 1 shows a front view of an embodiment of a switching battery charger in accordance with the principles of the present invention. Shown is a metal housing 101 which forms both a case for the enclosed parts and an electrostatic shield to reduce electromagnetic emissions from inside the metal housing. Also shown are several housing openings 102 which reduce the effectiveness of metal housing 101 as an electrostatic shield. Additional housing openings 102 are shown in FIG. 2. These housing openings allow cooling air for the fan 600, schematically shown in FIG. 2, allow for mounting the input plug 170 as shown in FIG. 1, and result from seams created when the metal housing 101 is assembled, shown in FIG. 3. These housing openings 102 allow electromagnetic emissions from inside the housing.

Figure 2A:
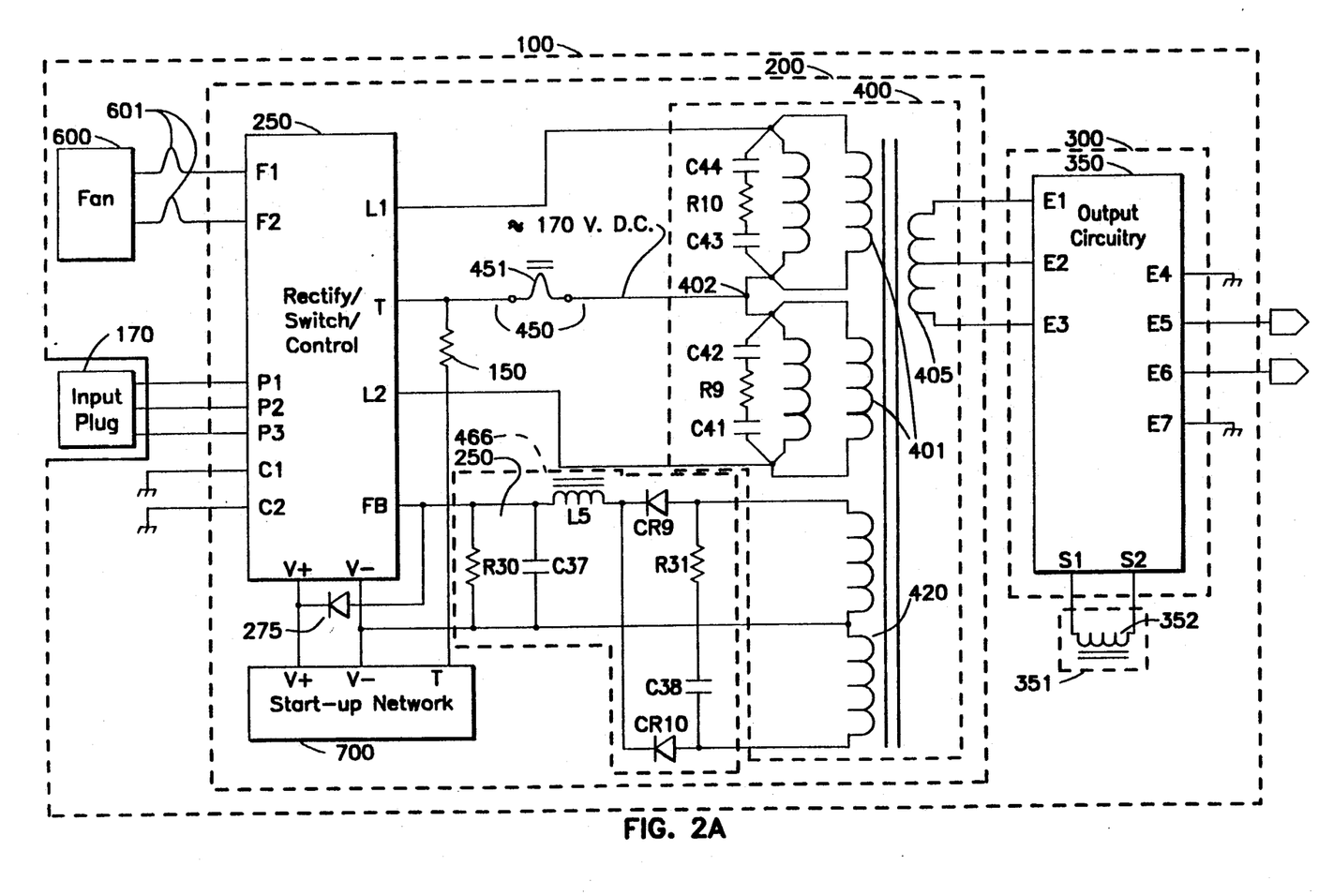
FIG. 2A is a simplified schematic diagram of an embodiment of a switching battery charger in accordance with the principles of the present invention.
Figures 2B, 2C:
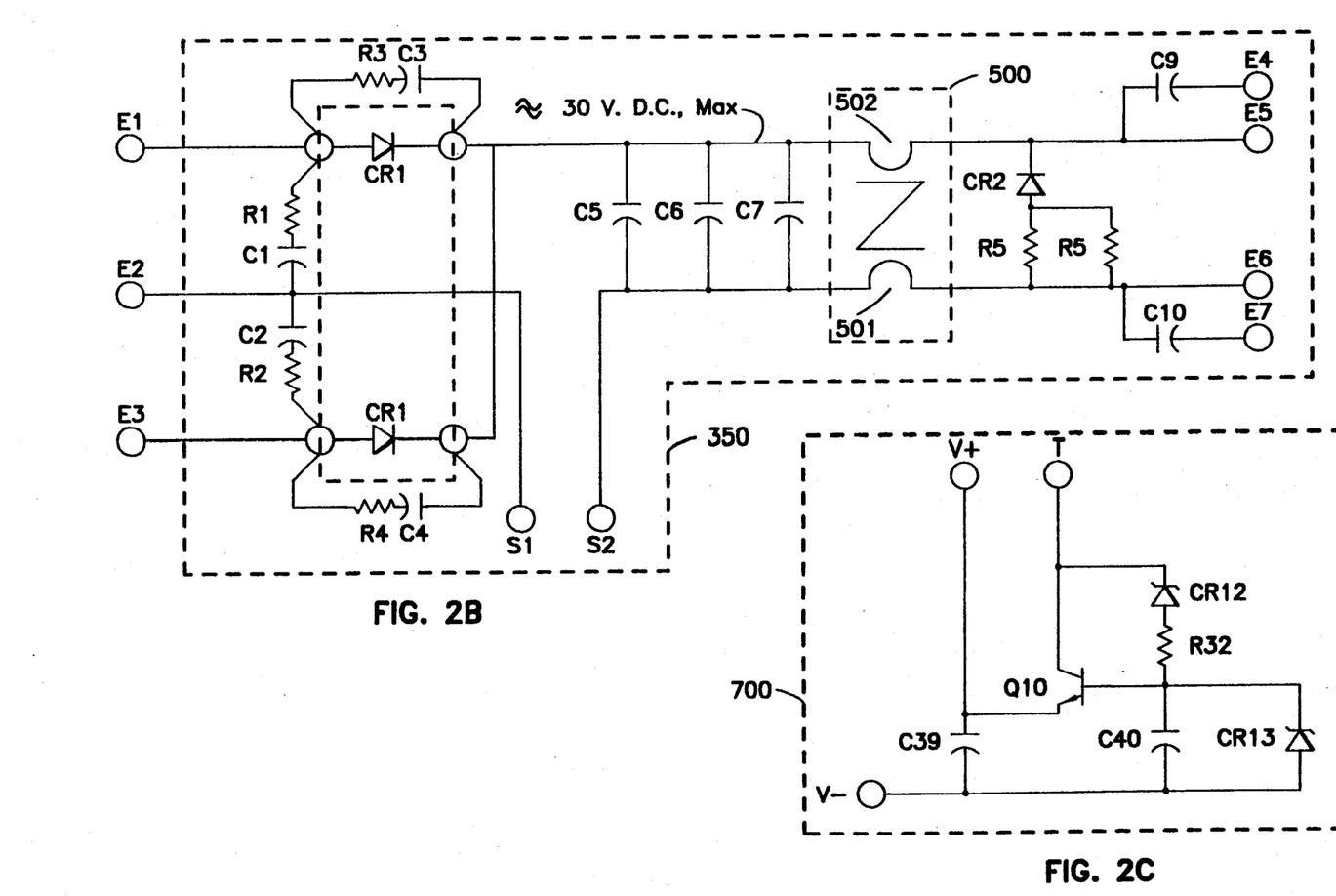
FIG. 2B is a schematic diagram of an output circuit of an embodiment of a switching battery charger in accordance with the principles of the present invention.
FIG. 2C is a schematic diagram of an embodiment of a start-up network referred to in FIG. 2A.
Figure 3:
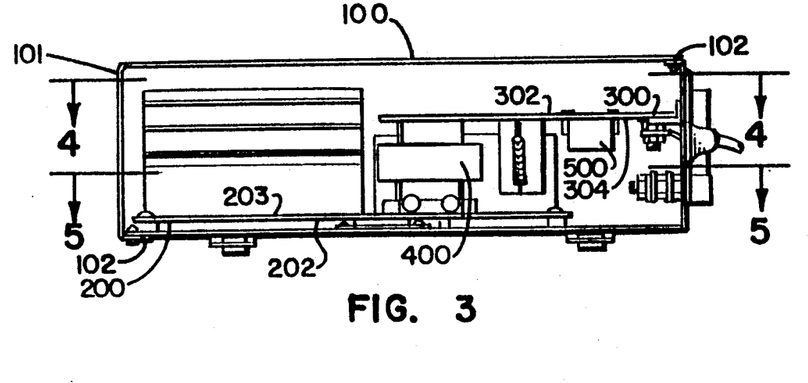
FIG. 3 is the simplified cut-away side elevational view as identified in FIG. 1, showing the layout and associated metal housing of an embodiment of a switching battery charger disposed in accordance with the principles of the present invention.
Figure 4:
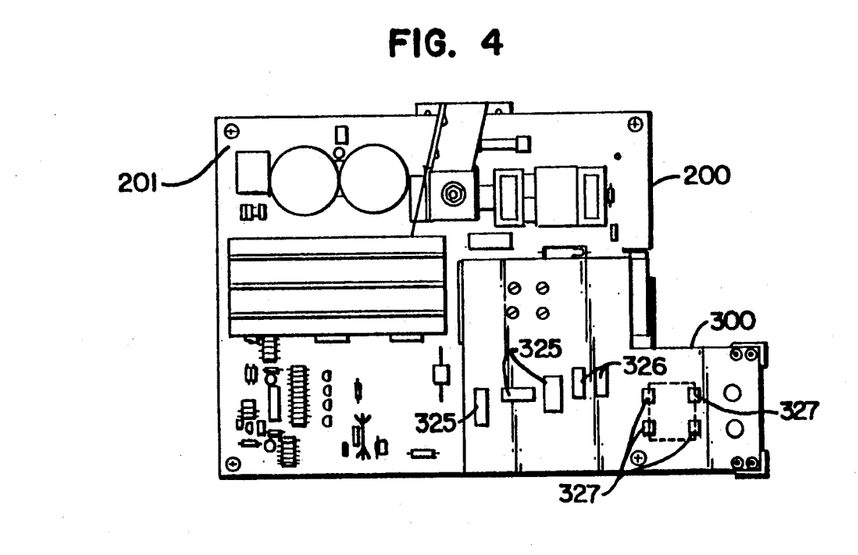
FIG. 4 is the simplified top down view identified in FIG. 3, showing the orientation of a primary assembly and a secondary assembly in accordance with the principles of the present invention.
Figure 5:
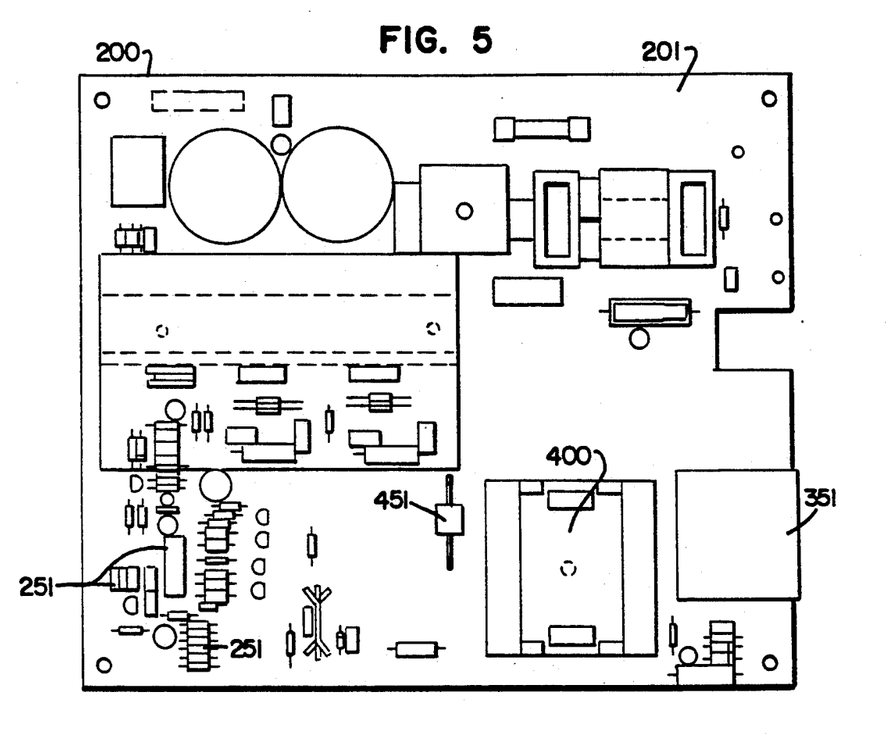
FIG. 5 is the simplified top down view identified in FIG. 3, showing the layout of a primary board in accordance with the principles of the present invention.
Figure 6:
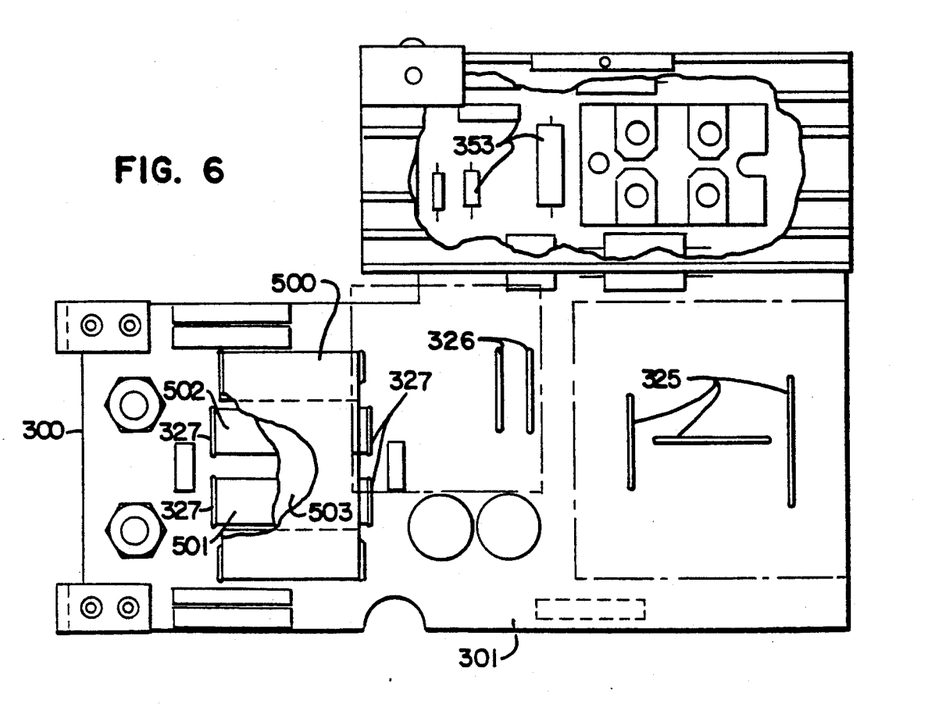
FIG. 6 is a simplified bottom up view of a secondary assembly showing the associated components and component slots in accordance with the principles of the present invention.

Schematic diagrams of a switching battery charger in accordance with the principles of the present invention are given in FIGS. 2A, 2B, and 2C. FIG. 2A shows that the switching battery charger is arranged into two main assemblies, a primary assembly 200 containing the control circuitry 250, and a secondary assembly 300 containing the output circuitry 350, except as noted in the next paragraph. FIG. 2A also show that the coupling between the main assemblies is by a power output transformer 400. FIG. 3 is a simplified cut-away side elevational view as identified in FIG. 1. Shown is the layout and the metal housing 101 disposed in accordance with the principles of the present invention. By separating the primary assembly 200 and the secondary assembly 300, unwanted coupling between the assemblies is reduced, which reduces electromagnetic emissions. Referring again to FIG. 3, power output transformer 400 is disposed between the primary assembly 200 and the secondary assembly 300, thereby separating the assemblies. Additionally, FIG. 3, along with FIG. 5, shows that the output filter inductor 351, a part of the secondary assembly 300, is mounted on the primary assembly 200. This is because the output filter inductor 351 is physically a large device not suitable for locating on the secondary assembly 300. However, as shown in FIG. 2A, all electrical connections with the output filter inductor 351 are with the secondary assembly 300. FIG.,s 4, 5, and 6 augment the understanding of the physical layout of a switching battery charger according to the principles of the present invention by showing a top down view of a primary assembly and a secondary assembly together, a separate top down view of the primary assembly 200, and a separate bottom-up view of the secondary assembly 300, respectively.

Separating the switching battery charger into two assemblies is not done randomly. FIG. 2A shows that the primary assembly 200 has approximately 170 volts on it while FIG. 2B shows that the secondary assembly 300 has a maximum voltage of approximately 30 volts. The much lower voltage existing on the secondary assembly 300 allows the conductors to be safely spaced closer together than if the switching battery charger was constructed on one board.

Figure 7:
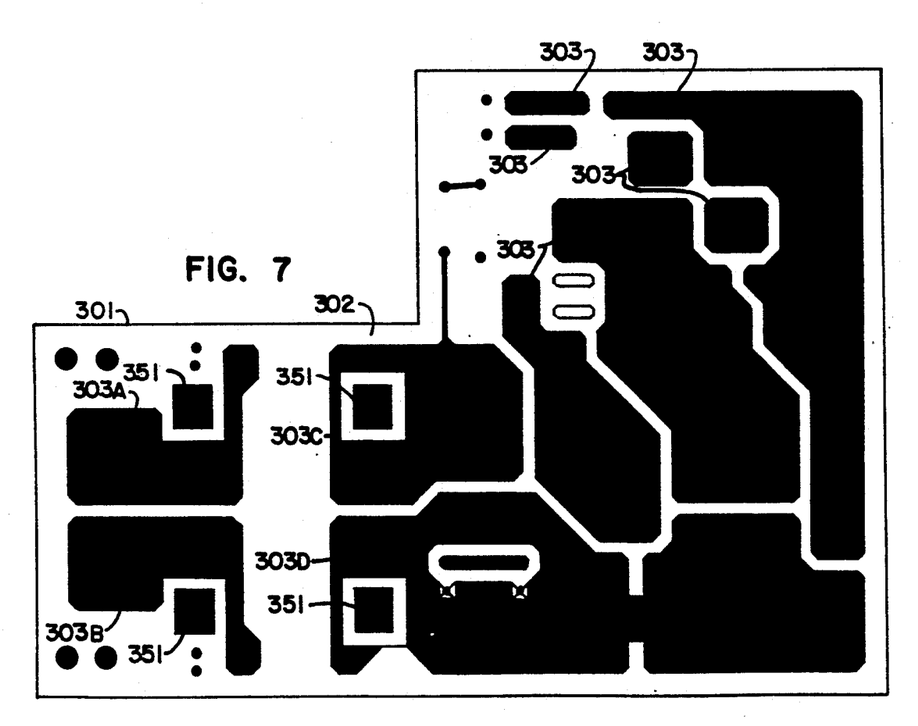
FIG. 7 is a view of a secondary assembly conductor pattern on a top surface of a secondary assembly in accordance with the principles of the present invention.

Referring now to FIG. 7. A secondary assembly conductor pattern 303 is formed on the secondary assembly top surface 302. Shown are secondary assembly conductor patterns 303 specially identified as 303A, 303B, 303C, and 303D. Secondary assembly conductor pattern 303A is located very close to and in parallel with secondary assembly conductor pattern 303B. Likewise, secondary assembly conductor pattern 303C is located very close to and in parallel with secondary assembly conductor pattern 303D. Secondary assembly conductor patterns 303A and 303C are connected together, as subsequently described, via the common mode output inductor positive winding 502 of the common mode output inductor 500. Secondary assembly conductor patterns 303B and 303D are connected together, as subsequently described, via the common mode output inductor negative winding 501 of the common mode output inductor 500. Because the common mode output inductor positive winding 502 and the common mode output inductor negative winding 501 electrically connect to the positive output terminal and the negative output terminal, respectively, they carry equal currents in opposite directions. By positioning secondary assembly conductor patterns 303A and 303B, and 303C and 303D, close together and parallel, the magnetic field components generated on the output lines cancel, thereby reducing electromagnetic emissions.

Referring once again to FIG. 7, all secondary assembly conductor patterns 303 are arranged so that the surface area enclosed by the secondary assembly conductor patterns 303 is minimized. This minimization of enclosed surface area is enhanced because, as discussed previously, the low voltage existing on the secondary assembly 300 allows for close spacing of the conductors. Because radiation from current-carrying conductors having high rates of change of current is proportional to the area enclosed by the conductors, the minimized surface area reduces electromagnetic emissions. Surface area minimization is limited by the conductor size required to conduct the current. In the preferred embodiment the conductors must carry approximately 55 amps.

Figure 8:
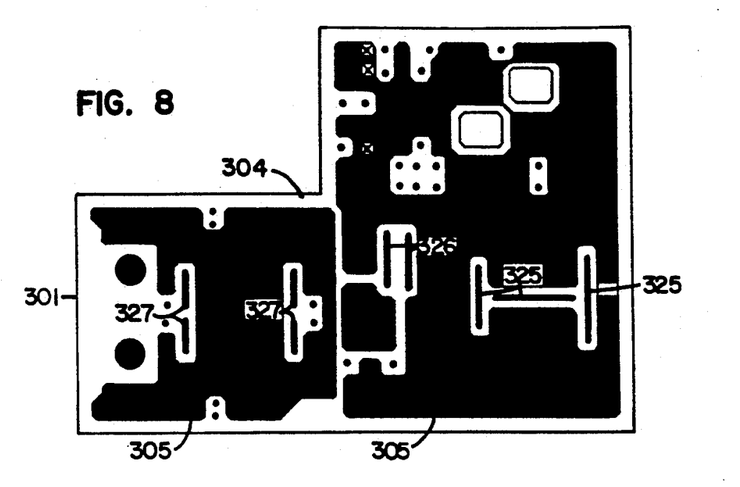
FIG. 8 is a view of a secondary assembly shield conductor pattern on a bottom surface of a secondary assembly in accordance with the principles of the present invention.

Referring now to FIG. 8. Secondary assembly shield conductor patterns 305 are formed over large portions of the secondary assembly bottom surface 304. Because of voltage distribution considerations, in the preferred embodiment of the present invention the secondary assembly shield conductor pattern 305 is divided into two parts. One part is maintained at 0 volts direct current and the other is maintained at a nominal twelve (12) volts direct current potential. However, both parts are at alternating current ground potentials and form an electrostatic shield between the primary assembly 200 and the secondary assembly 300. Other embodiments may use only a single pattern. Additionally, since the secondary assembly printed circuit board 301 is composed of an epoxy fiberglass laminate material having a dielectric constant of approximately 2.7 times that of air, the electric field between the secondary assembly conductor patterns 303 and the secondary assembly shield conductor patterns 305 tends to be concentrated in the dielectric rather than external air. This concentration acts to reduce the electric field portion of the electromagnetic emissions.

Referring to FIG. 2A, a ferrite bead 451 is placed in series with the power output transformer center tap 402, and another ferrite bead is placed around the conductors to the fan 600. Ferrite bead 451 reduces the rate of change of current through power output transformer 400, which reduces the amount of electromagnetic emissions created. Ferrite bead 601 reduces electromagnetic emissions by reducing the amount of high frequency signals getting to the fan 600, from which radiation is easy via housing openings 102 used for cooling. Additionally, ferrite bead 451 reduces electromagnetic emissions by absorbing high frequency noise susceptible to radiation on the power output transformer primary winding 401 which can capacitively couple to the power output transformer secondary winding 405, and than be radiated from the power output conductors.

Referring to FIG. 2A. Shown is a power output transformer 400 having a power output transformer primary winding 401, a power output transformer secondary winding 405, and a voltage control winding 420. Voltage control winding 420 is used to power the control circuitry 250 and to control regulation.

Figure 9A:
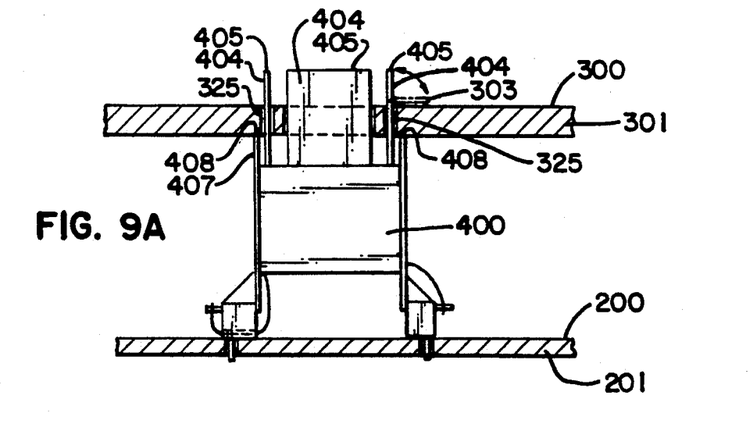
FIG. 9A shows a side view of a power output transformer disposed between a primary assembly and a secondary assembly in accordance with the principles of the present invention.
Figure 9B:
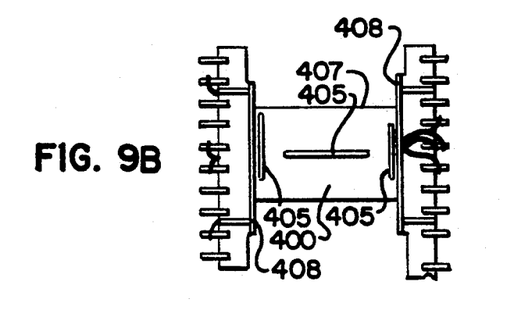
FIG. 9B is a top down view of a power output transformer in isolation in accordance with the principles of the present invention.

The power output transformer secondary winding 405 is wound with a foil conductor. As shown in FIG. 9A, this permits the power transformer secondary winding 405 to directly terminate on the secondary assembly conductor pattern 303 via transformer slots 325 in the secondary assembly printed circuit board 301. The secondary assembly 300 is placed on the power output transformer 400 in such a manner that the ends of the power transformer secondary winding 405 pass through transformer slots 325. The secondary assembly 300 mounts on the power output transformer 400 by resting on the power output transformer top surface 408.

Refer to FIG. 9A. The portions of the power output transformer secondary winding 405 that extend above the secondary assembly 300 are folded onto the secondary assembly conductor pattern 303 and soldered in place. This construction technique allows for quick, easy and reliable connections between the power output transformer 400 and the secondary assembly 300.

Another advantage of using foil windings is that variations in radiated emissions between switching battery chargers is reduced. This follows because the transformer slot openings, foil patterns, and transformer dimensions are tightly controlled, which means that the location of the power output transformer secondary winding 405 and the separation between the primary assembly 200 and the secondary assembly 300 are tightly controlled and repeatable.

Figure 10A:
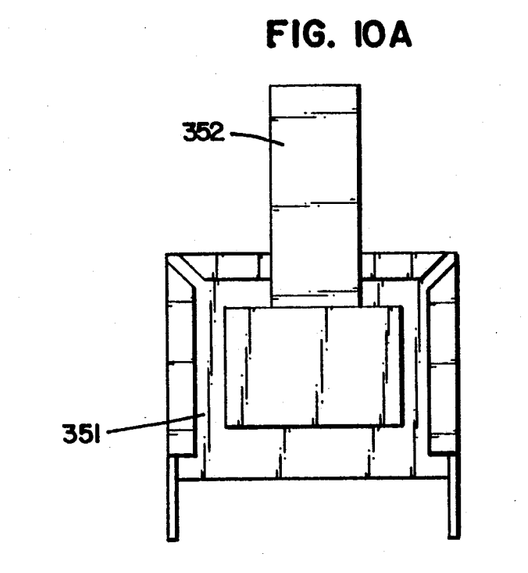
FIG. 10A shows a front view of an output filter inductor in isolation in accordance with the principles of the present invention.
Figure 10B:
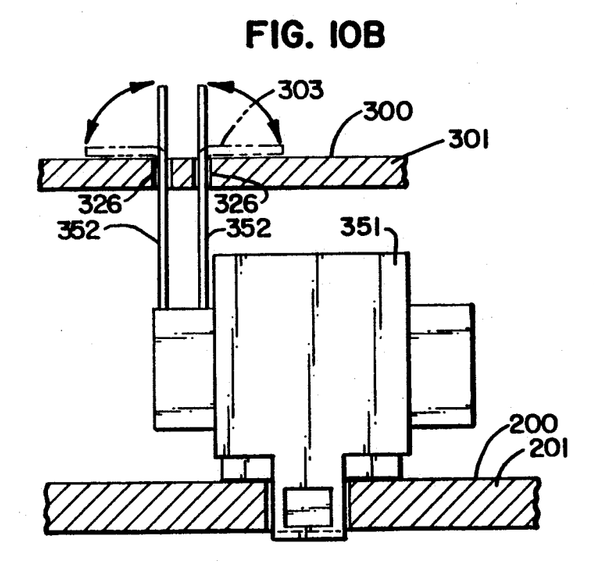
FIG. 10B shows a side view of an output filter inductor disposed between a primary assembly and a secondary assembly in accordance with the principles of the present invention.

Referring now to FIGS. 10A and 10B, as mentioned previously, output filter inductor 351 is physically large and is mounted on the primary assembly board. However, all electrical connections to it from the secondary assembly 300 via output filter inductor slots 326. Also as shown, the output filter inductor 351 is wound with a flat foil conductor.

Refer to FIG. 10A. The secondary assembly 300, primary assembly 200 and output filter inductor 351 are constructed so that when the secondary assembly 300 mounts on the power output transformer 400, the foil windings of the output filter inductor 351 align with the output filter inductor slots 326 on the secondary assembly 300. The ends of the output filter inductor winding pass through the output filter inductor slots 326, are folded in place over the secondary assembly conductor pattern 303, and are soldered in place. As explained when discussing the power output transformer, directly terminating large foil conductors to a printed circuit board results in a quick, easy and reliable electrical connection and allows the electromagnetic emissions to be more predictable.

Figure 11:
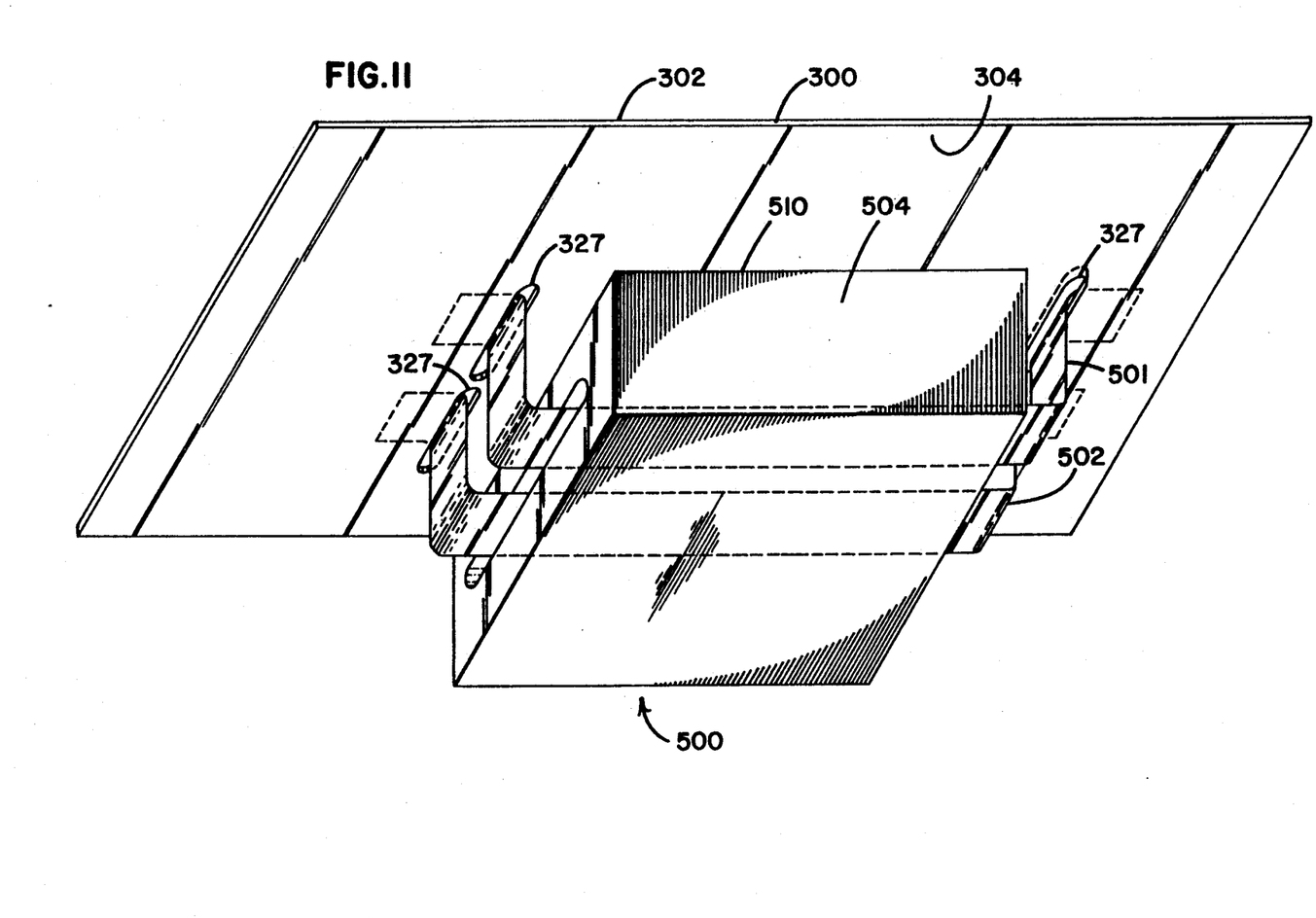
FIG. 11 shows a simplified perspective view of an embodiment of a common mode output inductor disposed on a bottom surface of a secondary assembly in accordance with the principles of the present invention.

FIGS. 3 and 11 show the common mode output inductor 500 mounted on the bottom side of the secondary assembly 300. In the preferred embodiment of the present invention, the common mode output inductor 500 consists of a common mode output inductor negative winding 501 and a common mode output inductor positive winding 502, both of which are flat foil conductors wound within ferrite core 504. The ferrite core 504 in the preferred embodiment of the present invention is a nickel-zinc ferrite similar to Fair-Rite material 43. This material has lossy characteristic which tends to absorb any high frequency components on the output conductors of the switching battery charger. Square contact pads 351 in FIG. 7 serve as attachment points for an electrostatic shield around the item 504.

The common mode output inductor 500 is wound in such a manner that the magnetic fields produced in the common mode output inductor core 504 due to currents in the common mode output inductor negative winding 501 and the common mode output inductor positive winding 502 tend to cancel. This canceling prevents saturation in the common mode output inductor core 504, even with the high current output. However, any noise component not common between the output leads is attenuated by the common mode output inductor 500.

As mentioned previously, the common mode output inductor 500 is mounted on the secondary assembly bottom surface 304 such that the common mode output inductor negative winding 501 and common mode output inductor positive winding 502 connect between secondary assembly conductor patterns 303B and 303D, and 303A and 303C. Refer to FIGS. 3, 8, and 11. The common mode output inductor 500 has a flat surface 510 that contacts the secondary assembly bottom surface 304. One end of the common mode output inductor negative winding 501 extends though the common mode slot 327 adjacent to conductor pattern 303B, the other end extends through the common mode slot 327 adjacent to conductor pattern 303D. The ends of the common mode output inductor negative winding 501 are fold over the adjacent conductor patterns and are soldered in place. In a similar manner, the ends of the common mode output inductor positive winding 502 are connected to conductor pattern 303A and to conductor pattern 303C. The advantages of quick, easy and reliable connections and the more predicable electromagnetic emissions characteristics between units resulting from this construction technique have been discussed above.

The flat surface 510 of the common mode output inductor 500 aids repeatability of assembly by locating the common mode output inductor negative winding 501 and the common mode output inductor positive winding 502 relative to the common mode slots and assists mounting by providing a large surface area for adhesives between the secondary assembly printed circuit board 301 and the common mode output inductor 500.

Referring now to FIG. 2A, there is shown a fusible resistor 150 electrically connected to the output transformer center tap 402. Fusible resistor 150 is a safety feature used to reduce the possibility of fire and to prevent the destruction of circuit components during a circuit malfunction, as explained below. In a prior switching battery charger produced by the assignee of the present invention, numerous types of electrical failures caused burnt boards and destruction of a large number of components.

In the preferred embodiment of the present invention, fusible resistor 150 connects to a start-up network 700. Start-up network 700 supplies power for internal operation of the switching battery charger immediately after the switching battery charger is powered up. Refer to FIG. 2C. After a short period of time, internal operating power is supplied from an internal power supply 466 powered via power output transformer secondary winding 420. Refer to FIG. 2A. After the internal power supply starts, the start-up network 700 goes to a standby state by the actions of diode 275. When an electrical failure occurs that disrupts operation of the switching battery charger, the output from the internal power supply 466 stops, and the start-up network 700 again supplies power. After a period of time, fusible resistor 150 opens and prevents the switching battery charger 100 from operating, thereby reducing the fire hazard and protecting components.

It is to be understood that even though the above numerous characteristics and advantages of the invention have been set forth in the foregoing description, together with details of the structure and function of the invention, the disclosure is illustrative only, and changes may be made in detail, especially in matters of shape, size and arrangement of parts within the principles of the invention, to the full extent indicated by the broad, general meaning of the terms in which the appended claims are expressed.

What is claimed is:

1. A power transformer apparatus, comprising:
   first and second printed circuit boards extending substantially parallel to one another;
   a core;
   a primary winding wound around said core;
   a secondary winding wound around said core with a flexible flat foil conductor;
   a body including a top surface adapted to support the first printed circuit board and a bottom surface adapted to mount on the second printed circuit board;
   means for electrically connecting the flat foil conductor of the secondary winding to a top surface of the first printed circuit board the connecting means including a plurality of slots on the first printed circuit board, the flexible flat foil conductor having terminal portions extending normally to the first printed circuit board top surface through the slots, the terminal portions being bent over the first printed circuit board top surface and electrically connected to the first printed circuit board; and
   means for electrically mounting the primary winding to the second printed circuit board of the bottom surface.

2. A common mode inductor apparatus comprising:
   first and second printed circuit boards;
   a core body having a substantially flat outer surface;
   a first winding wound with a first flat foil conductor within said core body;
   a second winding wound with a second flat foil conductor with said core body;
   means for electrically connecting the second winding to the first printed circuit board, the connecting means including a plurality of slots on the first printed circuit board, the second flat foil conductor having terminal portions extending normally to the first printed circuit board through the slots, the terminal portions being bent and electrically connected to the first printed circuit board; and
   means for electrically mounting the first winding to the second printed circuit board.

3. A power output inductor apparatus, comprising:
   first and second printed circuit boards;
   a core;
   a winding wound with a flat foil conductor around said core;
   means for electrically connecting the winding to the first printed circuit board, the connecting means including a plurality of slots on the first printed circuit board, the flat foil conductor having terminal portions extending normally to first printed circuit board through the slots, the terminal portions being bent and electrically connected to the first printed circuit board; and
   means for electrically mounting the winding to the second printed circuit board.

* * * * *